(12) United States Patent
Mansfield et al.

(10) Patent No.: US 8,392,871 B2
(45) Date of Patent: Mar. 5, 2013

(54) DECOMPOSITION WITH MULTIPLE EXPOSURES IN A PROCESS WINDOW BASED OPC FLOW USING TOLERANCE BANDS

(75) Inventors: Scott M. Mansfield, Hopewell Jct., NY (US); Geng Han, Fishkill, NY (US); Ioana C. Graur, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 12/770,791

(22) Filed: Apr. 30, 2010

(65) Prior Publication Data

US 2011/0271238 A1     Nov. 3, 2011

(51) Int. Cl.
*G06F 17/50* (2006.01)

(52) U.S. Cl. ............... 716/139; 716/55; 716/119

(58) Field of Classification Search .............. 716/55, 716/119, 139
See application file for complete search history.

(56) References Cited

U.S. PATENT DOCUMENTS

| 7,266,798 B2 | 9/2007 | Mansfield et al. |
| 7,908,572 B2 * | 3/2011 | Zhang ............... 716/53 |

* cited by examiner

*Primary Examiner* — Thuan Do
(74) *Attorney, Agent, or Firm* — H. Daniel Schnurmann

(57) ABSTRACT

Setting final dimensions while protecting against the possibility of merging shapes is provided by performing a decomposition of tolerance bands onto a plurality of masks for use in a multi-exposure process. This allows the maximum process latitude between open and short failure mechanisms, while also providing a mechanism to enforce strict CD tolerances in critical regions of a circuit. The decomposition enables co-optimizing various types of shapes placed onto each mask along with the source used to print each mask. Once the tolerance bands are decomposed onto the two or more masks, standard tolerance-band-based data preparation methodologies can be employed to create the final mask shapes.

14 Claims, 18 Drawing Sheets

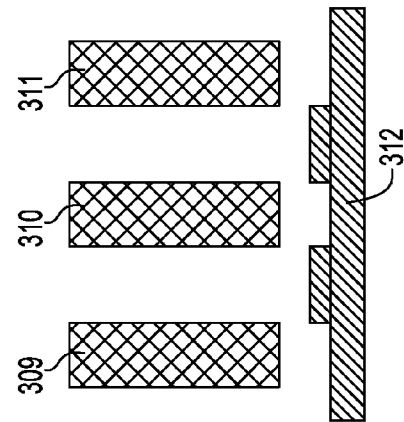
FIG. 3(a) (PRIOR ART)
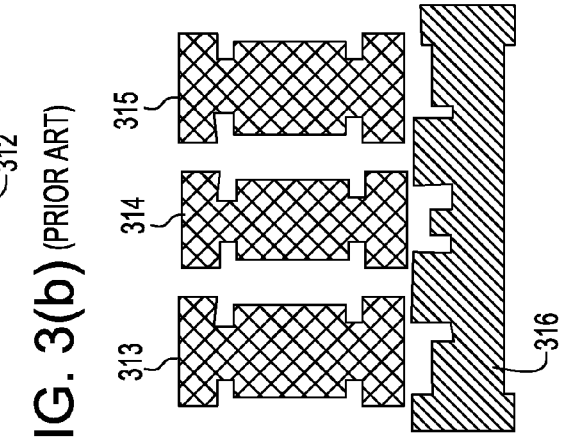
FIG. 3(b) (PRIOR ART)
FIG. 3(c) (PRIOR ART)
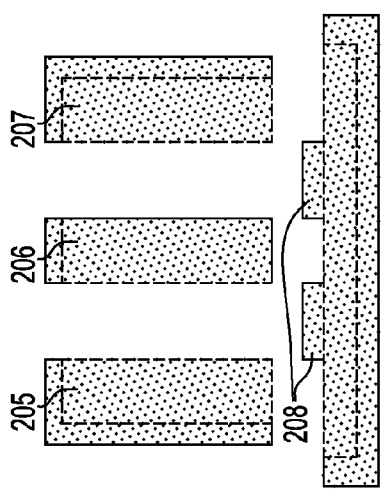
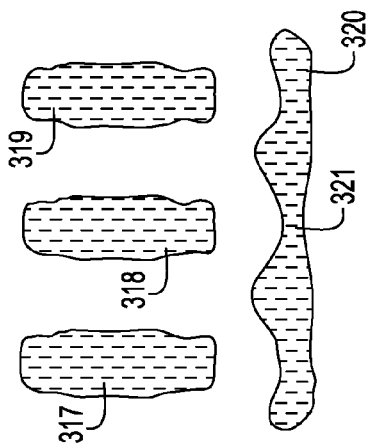
FIG. 3(d) (PRIOR ART)

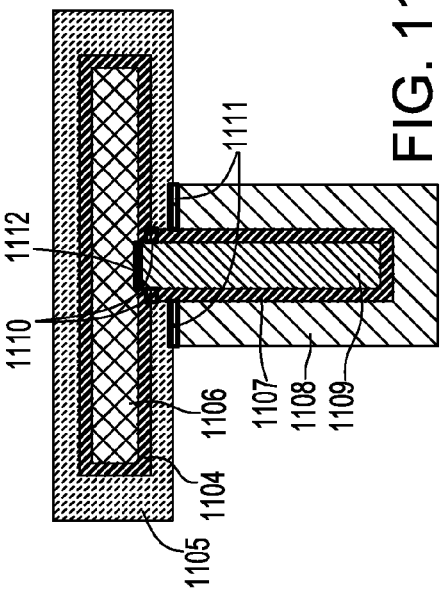
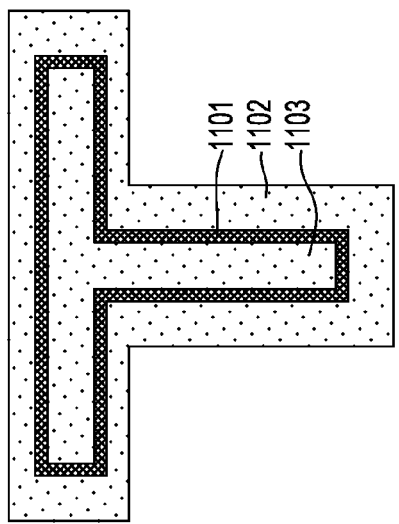
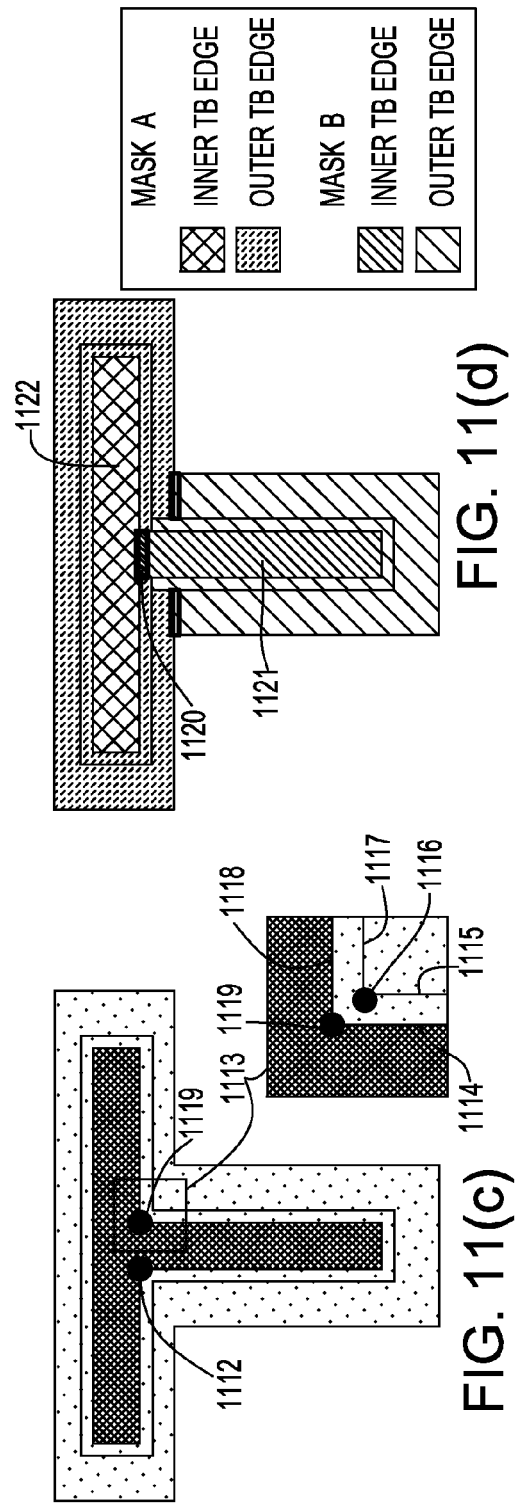
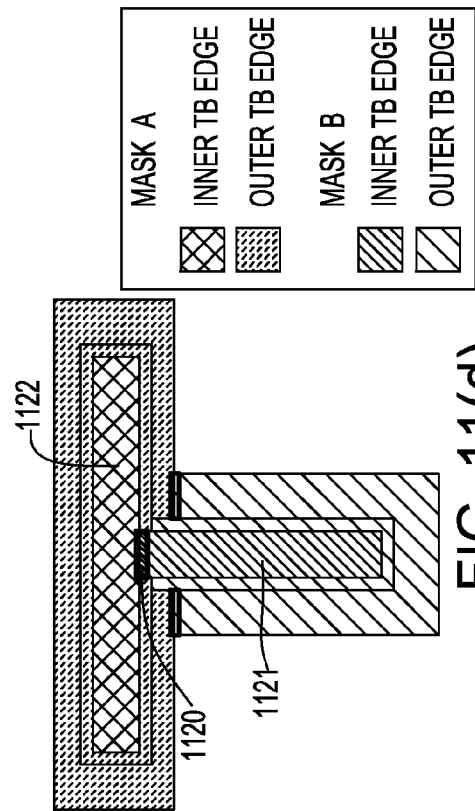
FIG. 11(a)
FIG. 11(b)
FIG. 11(c)
FIG. 11(d)

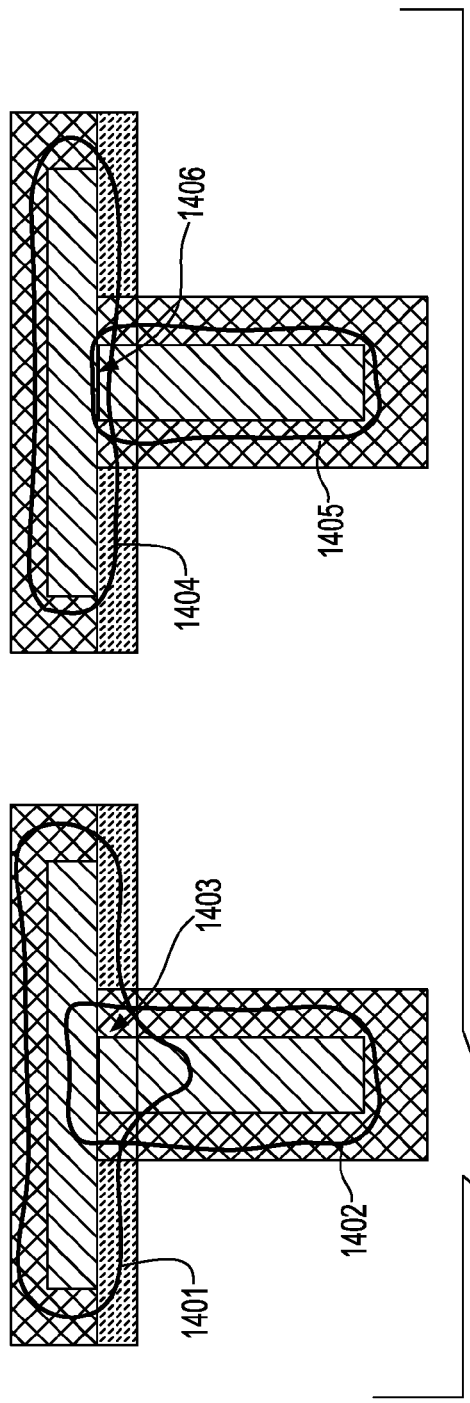
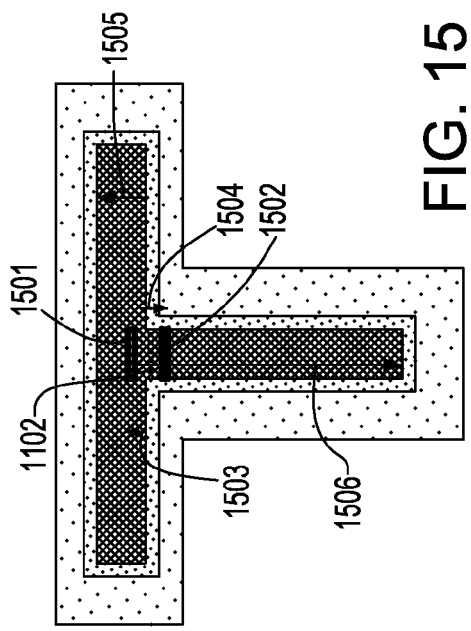
FIG. 14
FIG. 15

DECOMPOSITION WITH MULTIPLE EXPOSURES IN A PROCESS WINDOW BASED OPC FLOW USING TOLERANCE BANDS

FIELD OF THE INVENTION

The present invention relates generally to the field of Design Automation, and more particularly, to a method and data structure that enables decoupling resolution enhancement techniques to allow optimum printing of patterns.

BACKGROUND AND RELATED ART

With the need to print patterns at dimensions close to and in some cases beyond the physical limits of optical lithographic techniques, various techniques have been developed to enhance the resolution of optical exposure tools. One of the more extreme classes of these Resolution Enhancement Techniques (RET) is the use of multiple separate exposures to print a single pattern. Through the use of multiple exposures, the physical resolution limitations of an optical system can be overcome. However, multiple exposures alone cannot ensure adequate pattern fidelity for the multitude of layout geometries that exist in a standard semi-conductor design, and typically several RET techniques must be combined to achieve required tolerances and process latitudes. Unfortunately, RET techniques are often not independent of each other and the order in which they are applied may have a significant impact on the final patterning quality. As a result, it becomes necessary to find a methodology and data structure that enables decoupling of the RET techniques and allows for optimized solutions to be found.

Conventional single exposure optical lithography is limited in resolution to a minimum feature periodicity of $k1 * \lambda/NA$, where $\lambda$ is the wavelength of the exposure radiation, NA is the numerical aperture of the lens and k1 is a value that represents the difficulty of the imaging. K1 for a single exposure process is physically limited to a minimum value of 0.25, but for practical purposes in a manufacturing process with real process variation, k1 factors below 0.75 can cause significant challenges to the patterning process. In such "low k1" imaging scenarios, many techniques are used to improve pattern fidelity. Resolution Enhancement Techniques (RET) include off-axis illumination, assist features and Optical Proximity Correction (OPC). Off-axis illumination typically improves the printing of some types of patterns at the expense of other pattern types. In addition, off-axis illumination may lead to strong nonlinearities in the patterning process, so that features that are the same size on the photomask may print at different sizes on the wafer. These types of nonlinearities are often corrected using OPC, but in the extreme cases, the nonlinearities may result in some pattern sizes that simply cannot be achieved on the wafer. In those cases, a design retargeting step may be required, where forbidden patterns are made larger in size in the design layout. Assist features are often used to make all patterns on the photomask look more uniform in pattern density. If the assist features are smaller than the design features, then they will not transfer onto the wafer during the printing process. However, by making the photomask patterns more uniform, the patterning process can be better optimized. For a standard single exposure patterning process, the photomask design is typically created by first optimizing the illuminator, then applying retargeting, adding assist features and finally manipulating the mask sizes with OPC to ensure all patterns print at their target dimensions. Often, the entire process is referred to as OPC and that will be the case for the remainder of the application.

With design rules for advanced semiconductor processes now pushing required k1 factors down to 0.25 or smaller, single exposure patterning processes are no longer sufficient. To deal with this, one RET technique that is used is breaking up (decomposing) a design level into multiple mask layers which can be used to create a final wafer pattern by exposing each mask pattern in succession, with each mask either creating some portion of the final pattern or erasing unwanted features from a previous exposure, as shown, e.g., in FIGS. 1(a) through 1(c) wherein the design layout is illustrated consisting of shapes 101-104. These shapes can be decomposed into primarily vertical shapes 105-107 and horizontal shape 108. Mask A (117) can be created by applying industry standard process corrections, such as OPC, resulting in Mask A shapes 109-111. Mask B (118) shape 112 can be created in a like manner. Mask A and Mask B can be manufactured and used to print patterns on a semiconductor wafer using an industry standard multiple-exposure patterning processes. The result of this process is shown by wafer shapes 113-116 that are superimposed on their initial design shapes (101-104), as shown in FIG. 1d. The aforementioned illustrative example can be recognized having many variations on the process, some of which will be discussed hereinafter.

Moreover, still referring to FIG. 1c, the decomposed mask shapes are depicted separated to clearly illustrate the two masks 117 and 118. In subsequent figures, the separation will be assumed and the mask shapes for multiple masks will be drawn as if they were physically located next to each other, the mask distinction being shown by shape shading.

The RET is often divided into two broad categories: double exposure (DE) and double patterning (DP). In DE, multiple exposures are made into the same photoresist layer and that layer is then developed and processed to create the final pattern. In DP, a photoresist layer is only exposed with a single mask and then processed to create an intermediate transfer layer prior to another photoresist layer being added, exposed and processed. It is understood that these general categories can be extended beyond two masks to include multiple exposures (ME) and multiple patterning (MP); however, in the present application, only DE and DP will be considered. Likewise, many variations of DE and DP exist in the literature and it is understood that many of these variations will also benefit from the methodologies outlined in the application. For clarity, in the subsequent discussion, no distinction will be made between DE and DP, and in all cases, these will just be considered double exposure DE.

To enable DE patterning solutions, the shapes on a semiconductor design level no longer permit having a one-to-one mapping with shapes on a photomask that can be used to print that level on the wafer. Instead, a complex mapping of the design shapes to mask shapes must occur through a process known as decomposition. For instance, a typical DE decomposition methodology involves moving all horizontal shapes onto one mask and all vertical shapes onto the second mask. The decomposition is appropriate for a patterning process using two highly asymmetric illuminators, such as dipoles, often referred to as double-dipole-lithography (DDL). Likewise, one DP approach attempts to double the spatial frequency of printed gratings by printing every other line with one mask and the intermediate lines on another. Often referred to as pitch-splitting, this technique allows optical lithography to be used beyond the k1=0.25 physical limit. Accordingly, it is apparent that the nature of the decomposition process is highly dependent on the patterning process that will be used, including various RETs that may be used in that process.

In addition to multiple exposures, various other RETs are required to create a final pattern. By way of example, the illumination used in each of the exposures can be highly tuned to print a particular type of pattern. As in the case of DDL, where two dipoles are used to print patterns of different orientations, an illuminator optimization can be used in conjunction with decomposition to create highly optimized combinations of illumination and mask shapes. Automated source-mask-optimization (SMO) algorithms have been developed to achieve the highest degree of optimization. Likewise, other mask optimization techniques, such as sub-resolution assist features and phase shifting masks, can be used to allow optimum printing of desired patterns. For low k1 lithography, optical proximity correction (OPC) is required to pre-distort mask shapes in a manner that compensates for nonlinearities in the printing process. Typically, combinations of all of these RET are needed to achieve a robust patterning solution.

Despite all of these techniques, the lithography process that is exerted to its limits will still not allow all patterns to be faithfully reproduced on the wafer in the presence of normal manufacturing process variations. As a result, some design target shapes must be modified to align with process capabilities. The "retargeting" process often involves making isolated patterns larger, making patterns with small areas larger and expanding regions where patterns transition from one periodicity to another (i.e., fan-out regions). In a conventional single exposure process, retargeting can often be done based on rules applied to the target geometries. The fact that all the target geometries will be printed by the same exposure make it relatively easy to predict which patterns will have printing problems and will need to be expanded, even prior to the final mask shapes being determined, as shown in FIG. 2. Herein, design shapes 101-104 are expanded or retargeted, to create larger target shapes 205-208. Still in FIG. 2, a single exposure process is used, so shapes 205-208 are used as target shapes for OPC and mask shapes 209-212 are created. Printing the mask onto a wafer using a single exposure patterning process results in printed shapes 213-216 which are shown superimposed on the original target shape 101-14 in FIG. 2d. The printed shapes are bigger than the original targets, but may suffer from regions having a high risk of shorting, 217, or an overall high sensitivity to process variations due to the nature of the single exposure process.

Applying a retargeting flow similar to the one for use in a decomposed process may lead to significant patterning problems and ultimately yield loss. The reason for that can be seen with reference to FIG. 3, where similar to FIG. 2, a retargeting step is used to expand all isolated edges in the original target design, i.e., 205-208. The retargeted shapes are then decomposed based on a DDL decomposition algorithm to create target shapes for two mask designs, with 309-311 representing mask target shapes for Mask A and 312 being a mask target shape for Mask B. Standard RET and OPC data preparation techniques are then used to create mask designs, consisting of OPC'ed shapes 313-315 for Mask A and OPC'ed shape 316 for Mask B. Printing the mask shapes with a double exposure patterning process results in wafer contours 317-320. Since the retargeting is done on the pre-decomposed layout, isolated regions on each mask cannot be properly found and printing problems can arise. For example, region 321 will be printed with a relatively isolated mask shape, but will not have any retargeting done to boost the process window. So, the impact of this becomes a risk of the pattern pinching off.

Likewise, FIGS. 4 and 5 show similar problems found in a real design layout. In FIG. 4, short horizontal segment 401 does not receive any retargeting, but is printed as a relatively isolated segment in a double exposure patterning process. The resulting contour, based on simulating the printing process, shows a tendency to pinch at region 402. Similar problems can be seen in FIG. 5 where vertical segments 501-504 have many horizontal segments in close proximity of one another. This results in no retargeting of the design and subsequent printing problems in the double exposure process, leading to regions of failure risk at 505-508.

The reason for the aforementioned failures lies in the fact that when a decomposition technique is used, the process latitude to print a particular target feature is not known at least until the decomposition step is complete and, more accurately, once the full RET/OPC steps are complete. So, it may seem reasonable to move the retargeting step after the decomposition step, as shown in FIG. 6, where decomposed mask target shapes 105-108 are retargeted according to their decomposed environments to create retargeted target shapes 609-611 for Mask A and 612 for Mask B. In this case, the local environment for each target pattern is known at the time of retargeting, and the information can be used to accurately predict which shapes will have a weak process margin and will need to be retargeted. The retargeted target shapes can then be used to create mask shapes 613-615 for Mask A, and 616 for Mask B. However, this approach also has some drawbacks. If each decomposed mask design is retargeted independently, then there will be locations where target shapes on both masks will be expanded into the same region. In this case, when the final pattern (617-620) is created on the wafer, retargeted patterns will have a risk of bridging or merging, together causing failure of the circuitry, for instance at location 621.

Since the subsequent RET and OPC (optical proximity correction) data processing that is carried out beyond the retargeting and decomposition steps is dependent upon having a known target that is to be reproduced on the wafer, it is not feasible to move the retargeting step any further into the data preparation flow. However, one can attempt to approximate that by exercising process window OPC (PWOPC), where the OPC is not forced to converge to the exact target shape, but is given some leeway to print the shape off-target at nominal process conditions. The goal of the PWOPC algorithm is typically to print all edges within some pre-defined tolerance under normal process variation. The tolerance information can be specified in the form of a tolerance band or target band drawn or generated around each edge.

Referring to FIG. 7, an example of the use of tolerance bands for process window OPC is illustrated. Therein, a single exposure technique is depicted and retargeted shapes 205-208 are created based on the full environment for each exposure. In this case, tolerance bands are created using one set of rules that describe an inner and outer tolerance for the width of the line and another set of rules that describe an inner and outer tolerance for the length of the line, the result of which consisting in outer tolerance shapes 713, 715, 717 and 719, and inner tolerance shapes 714, 716, 718 and 720. Process window based OPC techniques can be used to create mask shapes 721-724 which result in printed wafer shapes 725-728 when printed with a single-exposure process. Although this technique may allow a printing process to keep edges within their tolerance through a broader range of process variation than the standard retargeted single-exposure process of FIG. 2, it still suffers from the deficiency of being a single exposure process and will not provide adequate process latitude under aggressive design rules.

Referring to FIG. 8, a more advanced method of creating tolerance bands for a single exposure process is shown, as described, e.g., in U.S. Pat. No. 7,266,798. In the cited patent, multilayer checks are used to create tolerance bands that better match the important electrical tolerances of the circuitry. These tolerance bands account for the full three-dimensional nature of the circuits when printed on the wafer and are created by analyzing each layer in the design in the context of layers above and below them. The result is a larger variation in the size of the tolerance bands as defined by outer tolerance shapes 813, 815, 817 and 819, and inner tolerance shapes 814, 816, 818 and 820. Process window based OPC applied to the tolerance bands results in mask shapes 821-824 and wafer patterns 825-828. Such a technique helps to reduce the failure risk. However, the prior art does not anticipate pattern decomposition and, therefore, can only allow tolerance band generation once each of the mask target layers have been fully defined through decomposition. No methodology prior to now has been disclosed or anticipated on how to optimize tolerance bands for a multiple exposure process.

SUMMARY OF EMBODIMENTS OF THE INVENTION

Accordingly, there is a need in the semiconductor industry for a method for generating tolerance bands on a pre-decomposed layout and for decomposing the tolerance bands, rather than target shapes, for use in subsequent data preparation for each of the individual masks. In doing so, retargeting allowances can be well balanced between each mask design while also ensuring no risk of pattern failure.

In one aspect of the invention, a method and a data structure are provided that enable decoupling the RET techniques, making it possible to achieve improved and potentially optimized results.

In another aspect, the invention decomposes tolerance bands onto two or more masks for use in a multi-exposure process. By using tolerance bands to convey the available target edge leeway, data preparation steps that occur after the decomposition acquire a certain desirable flexibility in setting the final printed dimensions while also protecting against the possibility of merging shapes. This allows maximum process latitude between open and short failure mechanisms, while also providing a mechanism to enforce strict CD tolerances in critical regions of a circuit.

Tolerance bands are created for a single design level or multiple design levels using industry standard methodologies. The tolerance bands are then decomposed and separated onto tolerance band levels for two or more masks. The decomposition methodology enables co-optimizing various types of shapes placed onto each mask, along with the source used to print each mask. Once the tolerance bands are decomposed onto the two or more masks, standard tolerance-band-based data preparation methodologies can be employed to create the final mask shapes.

In still another aspect, the invention provides a method of decomposing tolerance bands onto multiple masks for use in a multiple exposure lithographic imaging, the method including: generating tolerance bands and mapping all tolerance band edges onto corresponding target edges; decomposing the target edges and copying corresponding tolerance band edges onto the masks as target edges; for each break in a target shape created during the decomposition, generating a new inner tolerance band edge at corresponding vertices, the inner tolerance band edges being created on all the masks affected by a break in the target shape; for each of the masks affected by the break in the target shape, determining any other mask affected by the break and projecting the new inner tolerance band edge in the direction of the interior of the inner tolerance until it reaches an opposite edge; creating rectangles based on the projections and keeping overlapping regions of all of the rectangles; moving the orthogonal edges of the new rectangle outward until they reach an outer tolerance band of one of the other affected masks; and moving cut vertices of the outer tolerance band being fixed until they reach a new shape.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

FIGS. 3, 4 and 5 show prior art illustrations of a decomposition process based on a retargeted designs, including simulations of the printed wafer contours showing the process results in patterns with a pinching risk.

FIG. 11 illustrates examples of a T-shaped target pattern and tolerance band decomposed into horizontal and vertical components.

FIG. 14 depicts the patterns resulting when the masks are used to print patterns in photoresist. FIG. 14(a) shows contours respectively printed by Mask A and by Mask B, wherein an overlap between the shapes that are printed by each mask is created to ensure continuity of the desired T-shape. FIG. 14(b) shows a second set of contours resulting from the two masks printing on the small side of their expected tolerance, wherein the smaller overlap region potentially may raise yield concerns.

FIG. 15 shows a method aimed for improving worst-case overlap of both exposures. Process window OPC algorithms may work better if there is a better match between PVB and width and the tolerance band width.

PREFERRED EMBODIMENTS OF THE INVENTION

The present invention will now be described in greater detail by referring to the following discussion with reference to the drawings that accompany the present application. It is observed that the drawings are provided for illustrative purposes and thus, they are not drawn to scale.

Figure 1A:
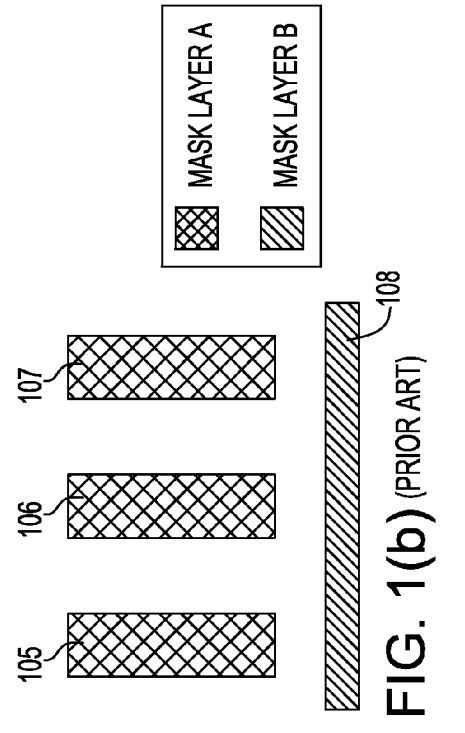
FIG. 1 is a schematic diagram of a prior art illustrative example of decomposing a design level into multiple mask layers by exposing each mask pattern in succession, with each mask creating a portion of the final pattern and erasing unwanted features from a previous exposure.
Figure 1D:
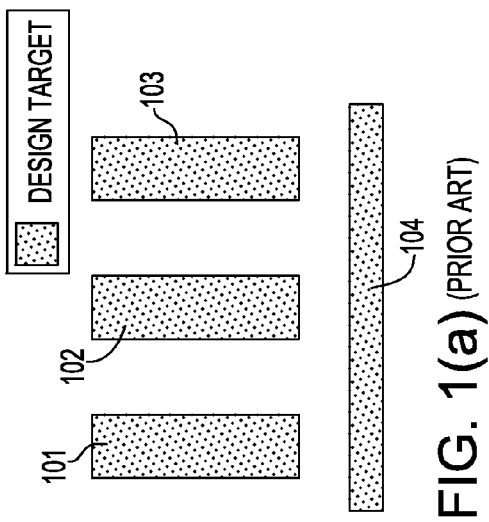
Figure 1B:
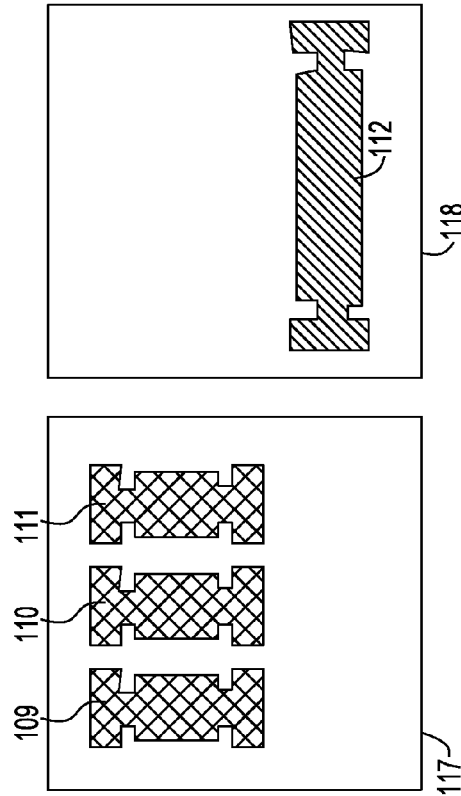
Figure 1C:
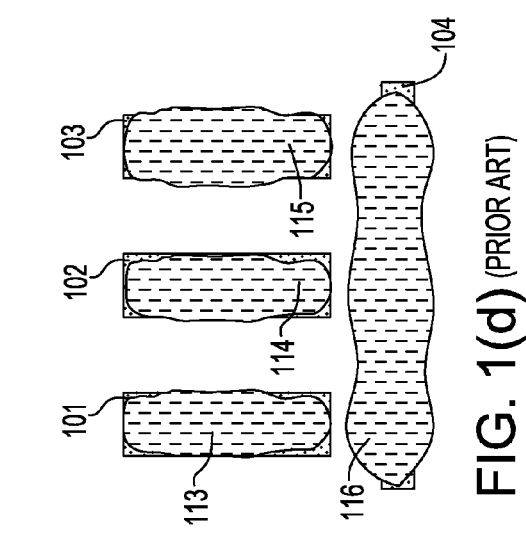
Figure 2B:
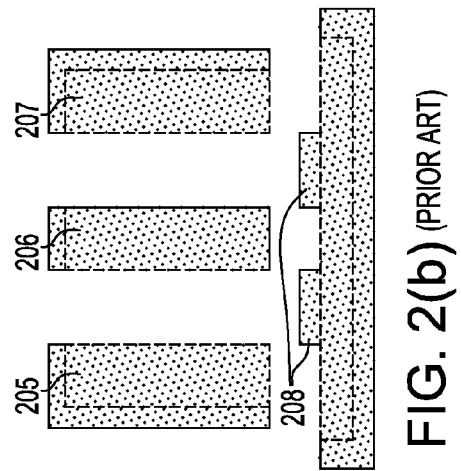
FIG. 2 shows prior art illustrations of a retargeting process making isolated patterns larger, making patterns with small areas larger and expanding regions where patterns transition from one periodicity to another.
Figure 2D:
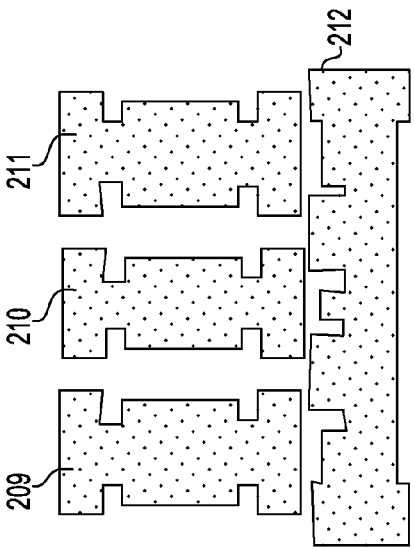
Figure 2A:
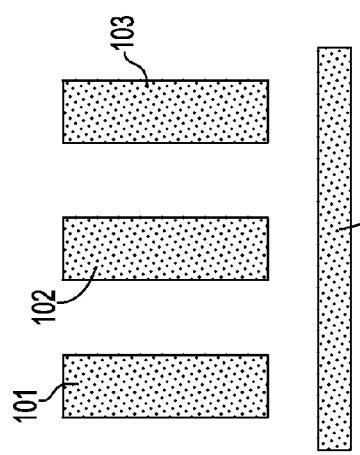
Figure 2C:
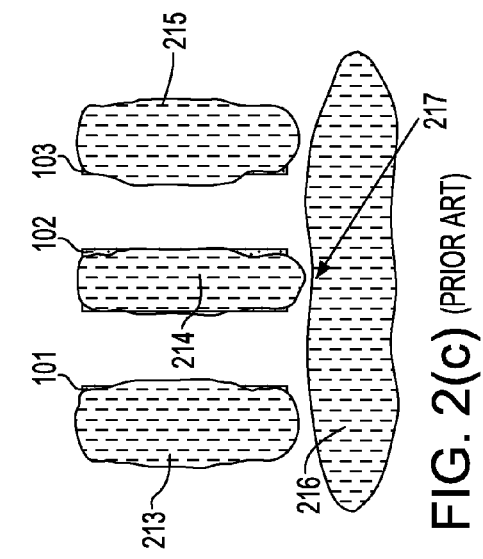
Figure 4:
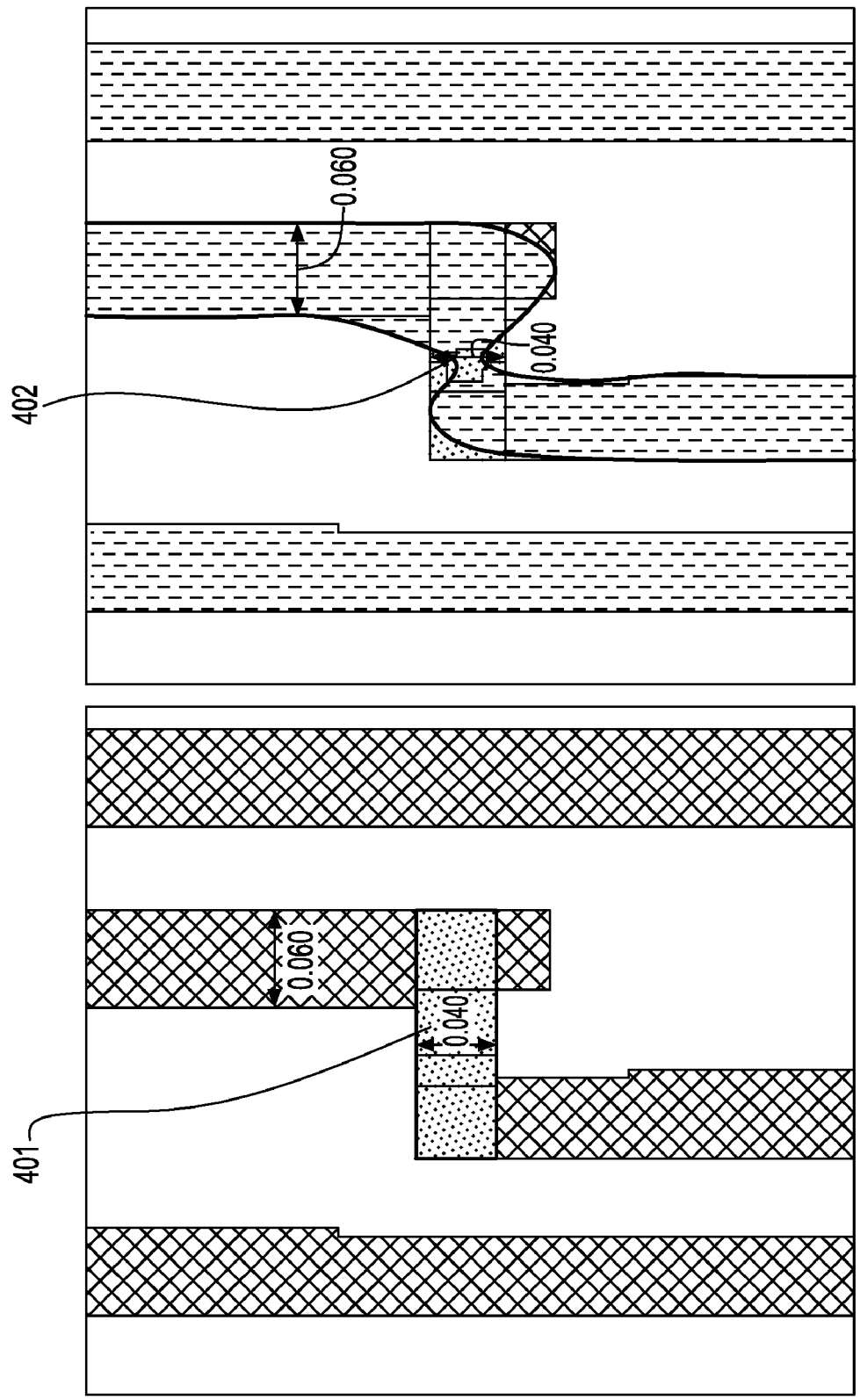
Figure 5:
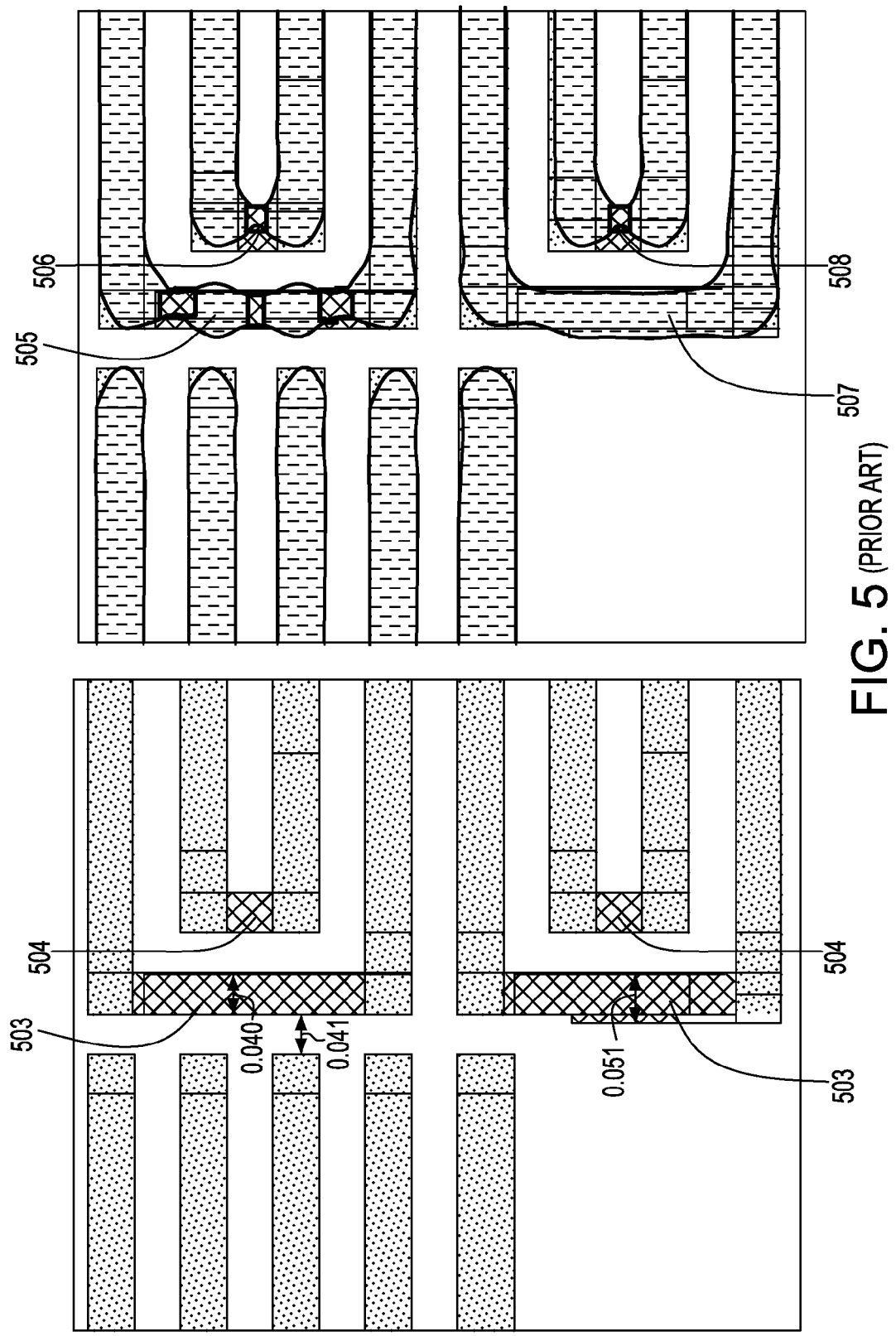
Figure 6B:
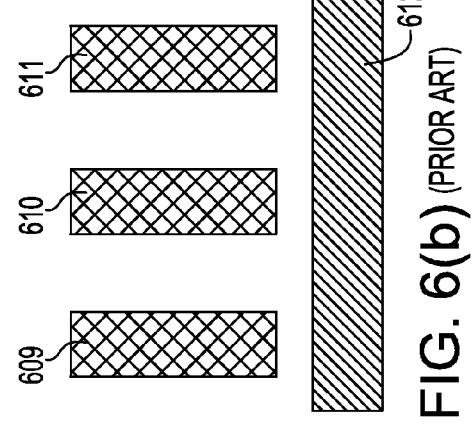
FIG. 6 illustrates a prior art process where a layout is first decomposed and then retargeted, including example post-OPC mask shapes and a simulation of the printed wafer contours.
Figure 6C:
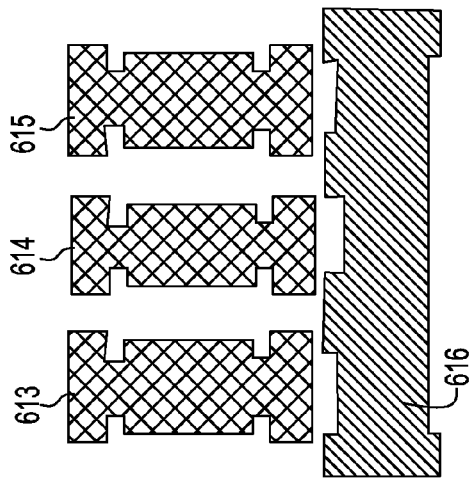
Figure 6A:
Figure 6D:
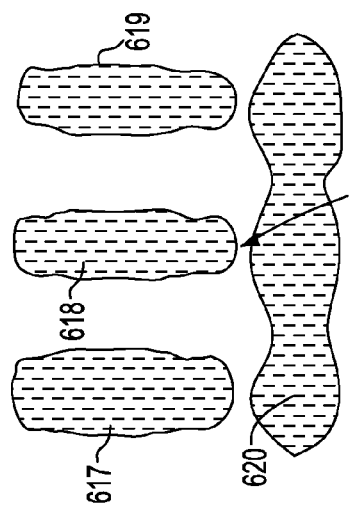
Figure 7B:
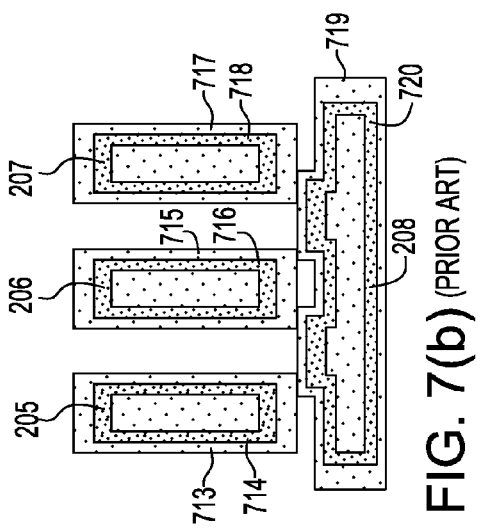
FIG. 7 shows a diagram illustrating the use of tolerance bands for a process window OPC in which a single exposure and retargeted shapes are created based on the full environment for the exposure.
Figure 7C:
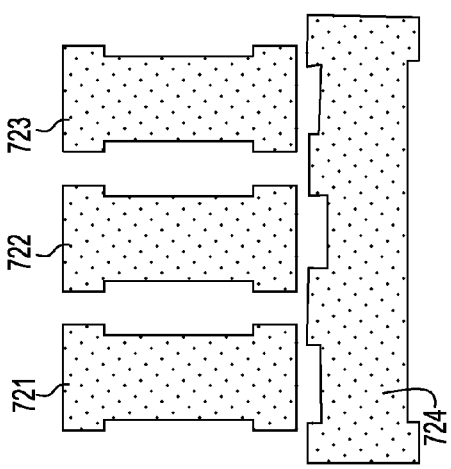
Figure 7A:
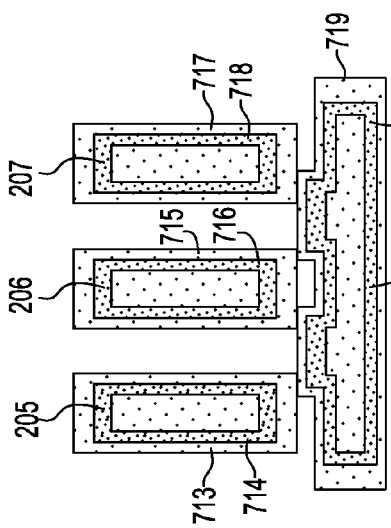
Figure 7D:
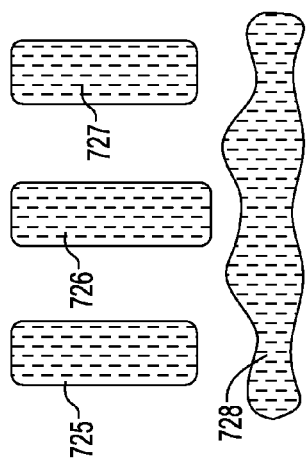
Figure 8B:
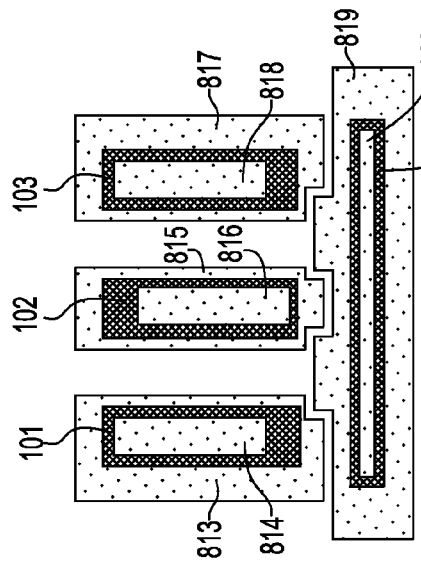
FIG. 8 shows a diagram illustrating a second use of tolerance bands for a process window OPC in which a single exposure is shown and retargeted shapes are created based on the full environment for the exposure.
Figure 8C:
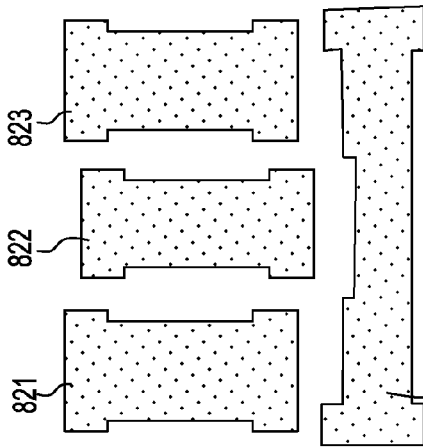
Figure 8A:
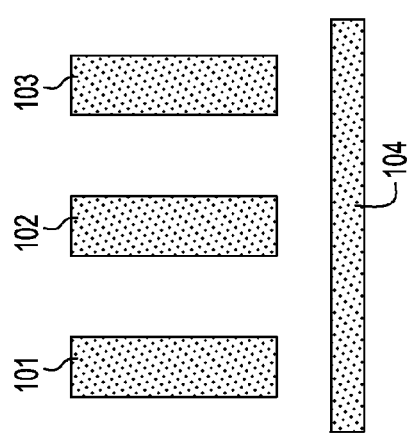
Figure 8D:
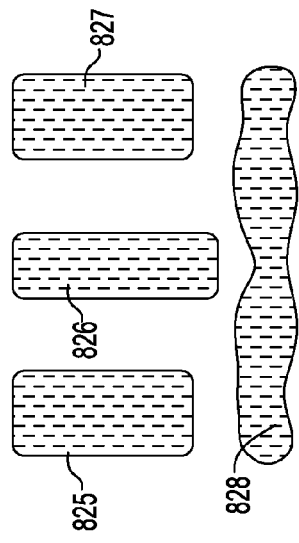
Figure 9B:
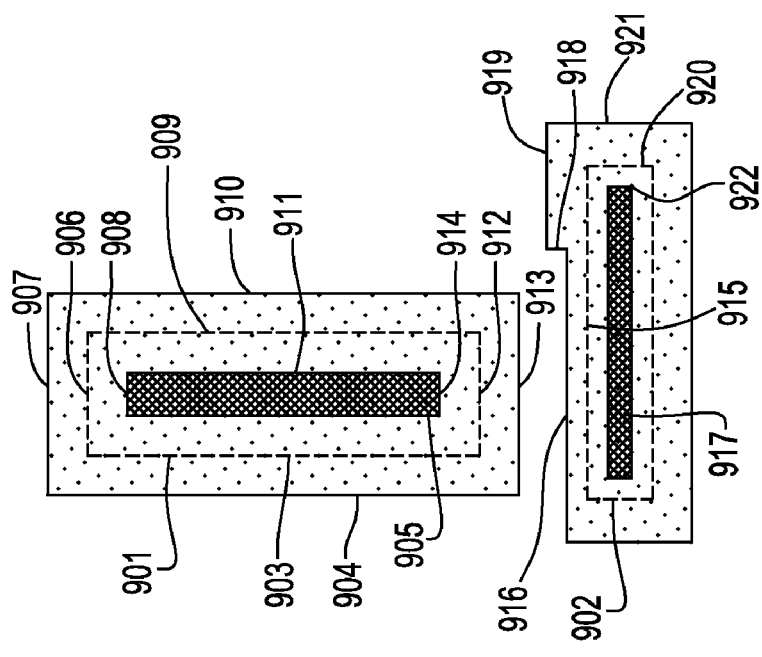
FIG. 9 is an illustrative example showing decomposing the tolerance bands followed by ensuring that the tolerance bands define whole, closed shapes, wherein each line segment of the tolerance band is mapped to a line segment on the original design target.
Figure 9A:
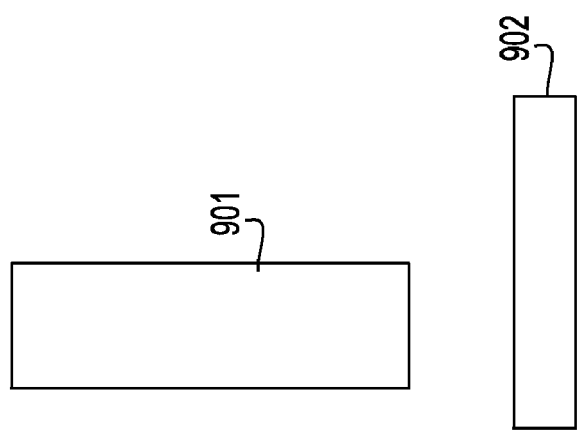
Figure 10A:
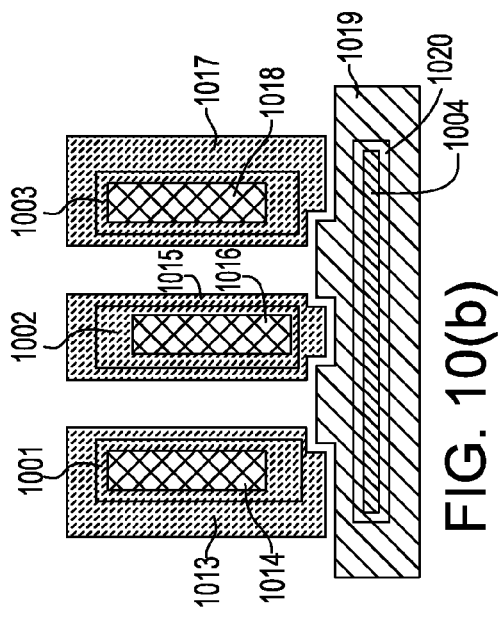
FIG. 10 shows an illustrative example of a design clip decomposed, wherein tolerance band edges are mapped onto design target edges and wherein mask designs based on a decomposition algorithm instead of or in addition to the original design target edges, according to an embodiment of the invention.
Figure 10B:
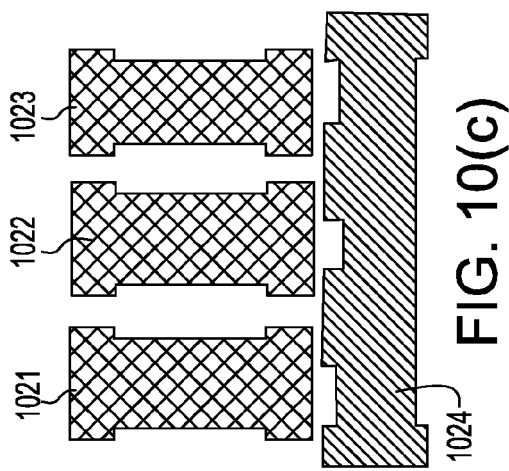
Figure 10C:
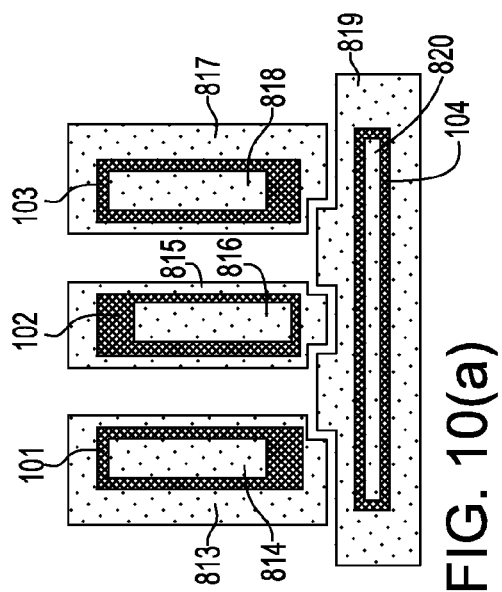
Figure 10D:
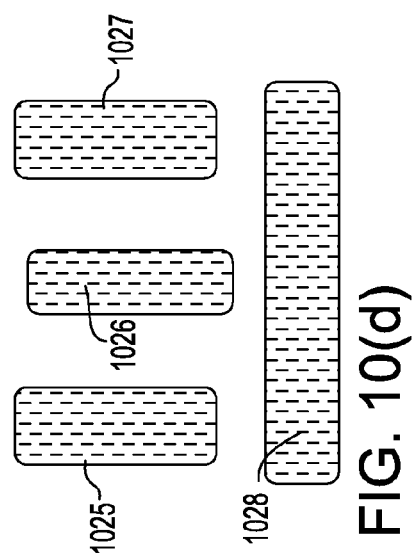

In one embodiment, the decomposed tolerance bands may be created by first decomposing the tolerance bands, followed by a clean-up step to ensure that the tolerance bands define whole closed shapes. To decompose the tolerance bands, each line segment of the tolerance band is mapped into a line segment on the original design target, as shown in FIG. 9. Depending on how the tolerance bands are created, mapping may already exist and show a one-to-one relationship. If the mapping does not exist, then it may be created, although it is not a critical aspect of the invention that a one-to-one mapping exists. The critical component is that all the edge segments of the tolerance band including both the inner and outer band segments be mapped to exactly one edge on the original design target.

By way of example, and still referring to FIG. 9, two original design target shapes 901 and 902 are depicted. Shape 901 consists of edges 903, 906, 909 and 912. Standard methods can be used to create outer tolerance band edges 904, 907, 910 and 913. The inner tolerance band edges 905, 908, 911 and 914 are then formed, in which case, tolerance band edges 904 and 905 are mapped to target edge 903; 907 and 908 to 906; 910 and 911 to 909; and 913, 914 to 912. Design target shape 902 has similar mapping of tolerance band edges, although in this case, an outer tolerance band has had a jog introduced, as illustrated by the three edge segments 916, 918 and 919. Accordingly, the outer tolerance band edges 916, 918 and 919 along with the inner tolerance band edge 915 are mapped onto target edge 915. The remaining tolerance band edges can be advantageously mapped in a similar manner, with 921 and 922 mapped onto 920, and the like.

Upon having the tolerance band edges mapped onto the design target edges, the decomposition can proceed as normal, wherein edge segments of the design target are copied to one of two or more mask designs based on a decomposition algorithm. However, in this instance, associated tolerance band edge segments may preferably be copied onto the mask designs instead of or in addition to the original design target edges.

Referring to FIG. 10, an example of a larger design clip decomposed is illustrated using a methodology, wherein the tolerance bands of FIG. 8, based on outer and inner tolerance shapes 813-820 are decomposed into outer tolerance shapes for Mask A 1013, 1015 and 1017 and inner tolerance shapes for Mask A 1014, 1016, 1018. The outer tolerance shape for Mask B 1019 and inner tolerance shape for Mask B 1020 are decomposed in a similar manner. Mask shapes 1021-1023 of Mask A and 1024 of Mask B are then created, preferably using a process window based OPC for each of the two exposures. The resulting wafer patterns after the double-exposure printing process 1025-1028 show a significantly improved process latitude due to the combination of tolerance bands and double exposure.

During the decomposition process, the algorithm may advantageously introduce breaks in the tolerance bands, so that the bands inhibit the closed target pattern to be created. This occurs in regions where two or more mask layers are required to create a continuous wafer pattern. By way of example, in a T-shaped pattern, the algorithm may break the closed T-shaped polygon into two separate polygons by placing the horizontal and vertical legs on different masks.

Referring to FIG. 11, T-shaped target pattern 1101 is decomposed into horizontal component 1104 and vertical component 1107. Likewise, outer tolerance band 1102 is decomposed into a corresponding horizontal component 1105 and vertical component 1108, while inner tolerance band 1103 is decomposed into 1106 and 1109. The decomposition of the T-pattern into horizontal and vertical components causes a break in target shape at 1110, resulting in shapes 1104 and 1107 being open shapes. Likewise, outer tolerance band shapes 1105 and 1108 have breaks at 1111, and inner tolerance band shapes 1106 and 1109 have breaks at 1112. Neither the inner tolerance band nor the outer tolerance band shapes are closed shapes. Combining both masks is required to create a final continuous T-pattern on the wafer. In such instance, a clean-up step is required to introduce new edge segments in overlapping regions. In the case of a T-pattern, additional edge segments are required on both legs, i.e., to fill in the bottom horizontal edge of the horizontal leg and to create the top line end of the vertical leg.

In an embodiment of the invention, for each region where multiple masks are needed to create a continuous wafer shape, a single additional edge segment is created on the inner tolerance band layers for each mask taking part in creating the shape. The location of the new inner tolerance band edge segment is somewhat arbitrary within one critical constraint: it must allow a continuous line to be drawn between the two tolerance bands touching each side in order for the line to fall within two adjacent tolerance bands and fall toward the "outer" side of the new edge segment. Various methods can be used to create this segment. However, it is preferable to directly connect the two vertices on the inner tolerance band that are opened by decomposition process. This is illustrated in FIG. 11(c) showing vertex 1116 separating target edge segments 1115 and 1117, pinpointing where the target is broken into two mask shapes. Corresponding vertex 1119 on the inner tolerance band determines where the inner tolerance band broke, forcing edge segments 1114 and 1118 to be moved to a separate mask. A corresponding vertex 1112 on the opposite side of the vertical section exists where another break of the inner tolerance band occurs. A new edge segment 1120 can then be drawn between 1112 and 1119 and a copy placed on the inner tolerance band levels for each mask. This results in closed shapes 1121 and 1122 for each inner tolerance band which, in turn, results in the inner tolerance band for each mask coinciding with each other for the segment 1120. The foregoing has important implications to the robustness of the solution. Alternatives will be discussed hereinafter.

Once the new inner tolerance band segments have been generated in which corresponding outer tolerance band edges must also be created for each mask. To find the outer band in one mask, all other masks must be considered. For sake of clarity, only two masks will be described hereinafter, although one may readily recognize that it can be extended to multiple masks. For the first mask, the shapes on the second mask are to be considered in order to determine how far the new inner tolerance band edge segment can move in a direction perpendicular to its length and into the interior of the inner tolerance band shape prior to reach an opposing edge of the outer tolerance band.

Figure 12:
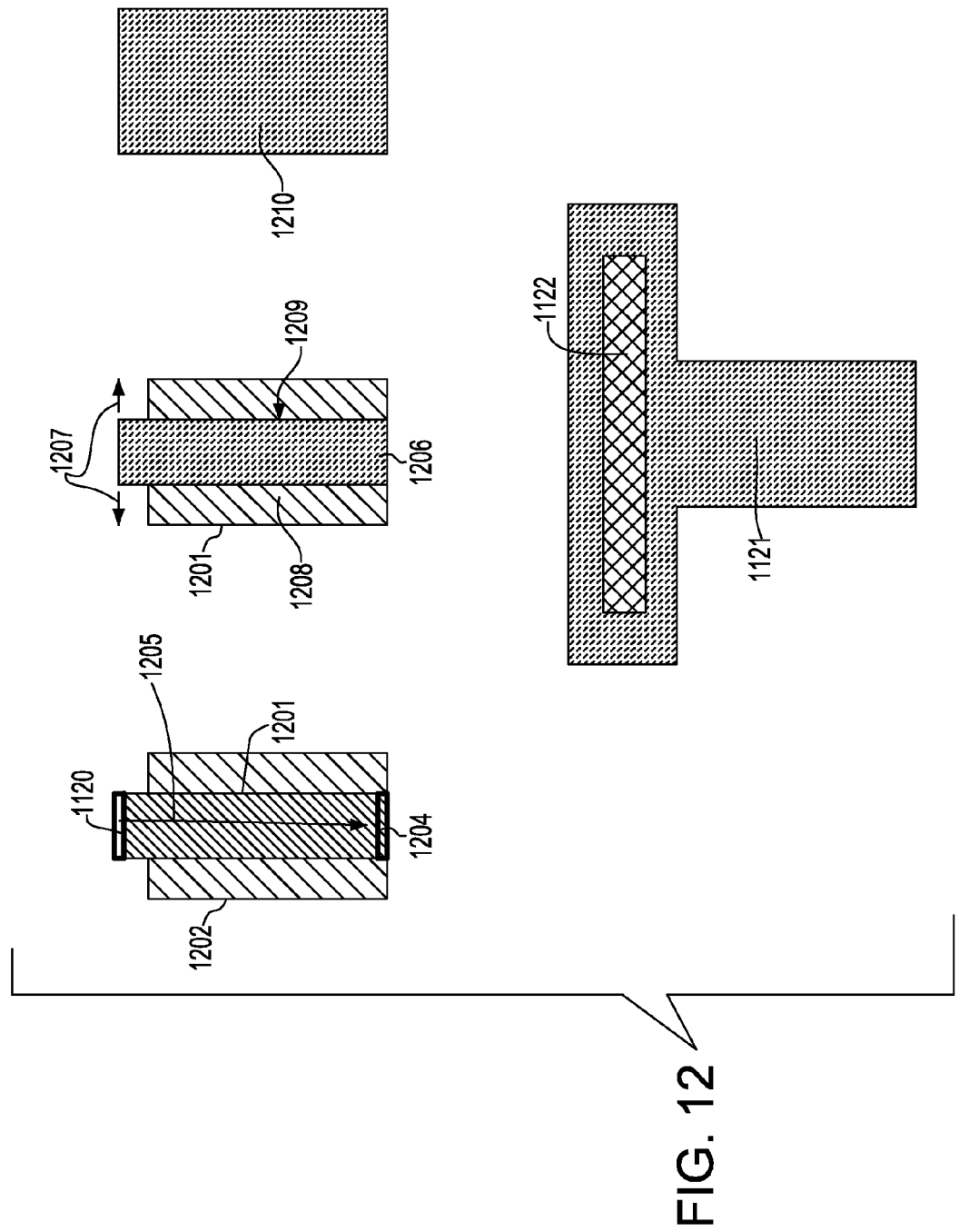
FIG. 12 shows an illustrative example of corresponding outer tolerance band edges created for a first mask once the new inner tolerance band segments are created, and where the outer band on one mask are found after all the other masks have been considered.

Referring to FIG. 12, numeral 1203 shows a copy of the new inner tolerance band edge 1120 that was placed on Mask B. The edge thereof is projected toward the interior of the inner tolerance band shape 1202 until it extends beyond the shape and abuts at an opposite edge on the outer tolerance band 1201 to form a new line segment 1204. A rectangle 1206 is then drawn from the newly created inner tolerance band edge 1120 to edge 1204. Next, the two edges 1208 and 1209 of the rectangle that are perpendicular to the newly created inner tolerance band edge 1120 are expanded until they reach the outer tolerance band of the second mask, a distance depicted by numeral 1207. The shape 1210 created is then moved onto the outer tolerance band layer of the first mask. Merging 1210 with existing outer tolerance band shape 1105 results in a closed shape for the outer tolerance band 1211 which, in conjunction with closed inner tolerance band 1122, makes up a complete tolerance band for the horizontal mask component on Mask A.

Figure 13:
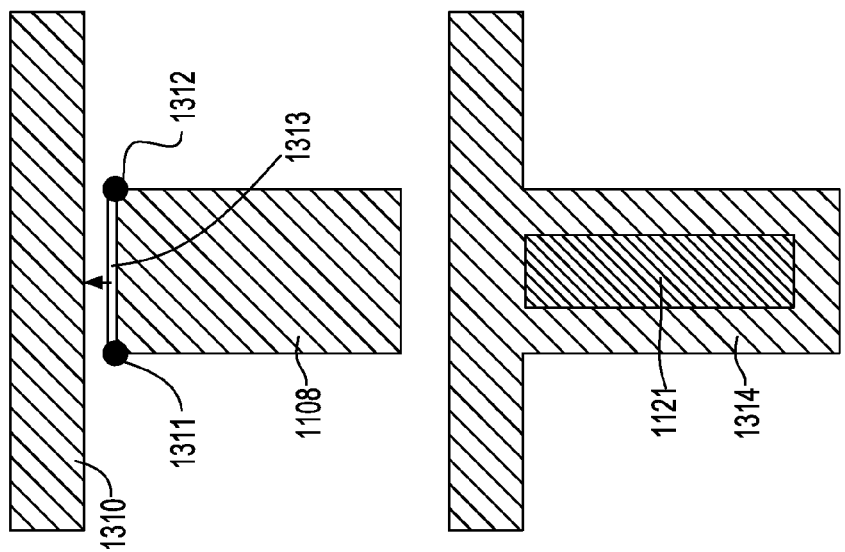
FIG. 13 shows an illustrative example of corresponding outer tolerance band edges created for a second mask once the new inner tolerance band segments are created, and where the outer band on one mask are found, all the other masks having been considered.
Figure 13:
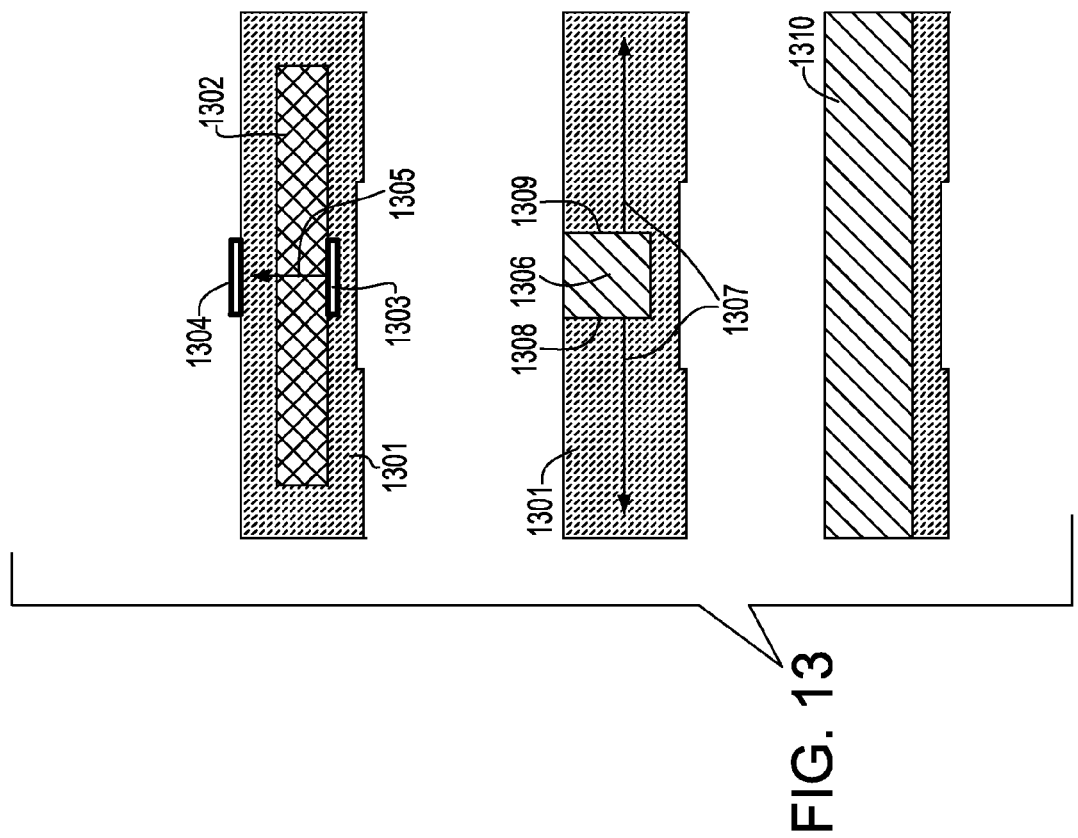

Referring to FIG. 13, similar steps are taken to create a vertical mask component on Mask B. Numeral 1303 shows a copy of the new inner tolerance band edge 1120 that was placed on Mask A. The edge is projected toward the interior of the inner tolerance band shape 1302 until it projects beyond the shape and reaches an opposite edge on the outer tolerance band 1301 to create edge 1304. Rectangle 1306 is then drawn from the newly created inner tolerance band 1303 edge to the edge 1304. Next, the two edges 1308 and 1309 of the rectangle perpendicular to the newly created inner tolerance band edge 1303 are expanded until abutting at the outer tolerance band of the second mask, a distance depicted by numeral 1307. The shape created 1310 is then moved onto the outer tolerance band layer of the first mask, in which case, 1310 cannot be directly merged with the existing outer tolerance band shape 1108. Instead, the "cut" vertices 1311 and 1312 of 1108 are moved until they reach the edge of 1310, i.e. a distance 1313. The shape is then merged with 1108, resulting in a closed shape for the outer tolerance band 1314, which along with the closed inner tolerance band 1121, makes up a complete tolerance band for the vertical mask component on Mask B.

Referring now to FIG. 14, the patterns shown are that result from masks used to print patterns in photoresist. Contour 1401 is printed by Mask A, and 1402 by Mask B. The region 1403 shows an overlap between the shapes printed by each mask. The overlap region insures continuity of the desired T-shape. Still referring to FIG. 14, a second set of contours 1404 and 1405 is illustrated resulting from printing the two masks on the smaller side of their expected tolerance. Note that the small overlap region 1406 may cause yield concerns.

Referring to FIGS. 15-18, in one embodiment, the method described is aimed at improving the worst-case overlap of both exposures, which is particularly important for overlay concerns for double-patterning where secondary processes, such as etch. However, these are not well understood, characterized or modeled. By way of example, if an etch process is used after the lithography printing process to create the final wafer pattern, the etch process may actually shrink the patterns relative to the lithographic printed patterns. In this case, if mask targets are created to print lithographic wafer targets without accounting for a shrinking etch process, the worst case overlap may not suffice to allow for continuity of all the shapes printed with multiple exposures after the final etch shrink occurs.

Referring to FIG. 15, a derived edge 1102 overlaid on the pre-decomposed layout and tolerance bands is illustrated. The edge is split into two separate edges 1501 and 1502 which are offset in opposite directions by distances 1503 and 1504. Distances 1503 and 1504 should be equivalent or larger than the mask to mask overlay specifications, while remaining smaller than the orthogonal width of inner tolerances shapes 1505 and 1506.

Figure 16:
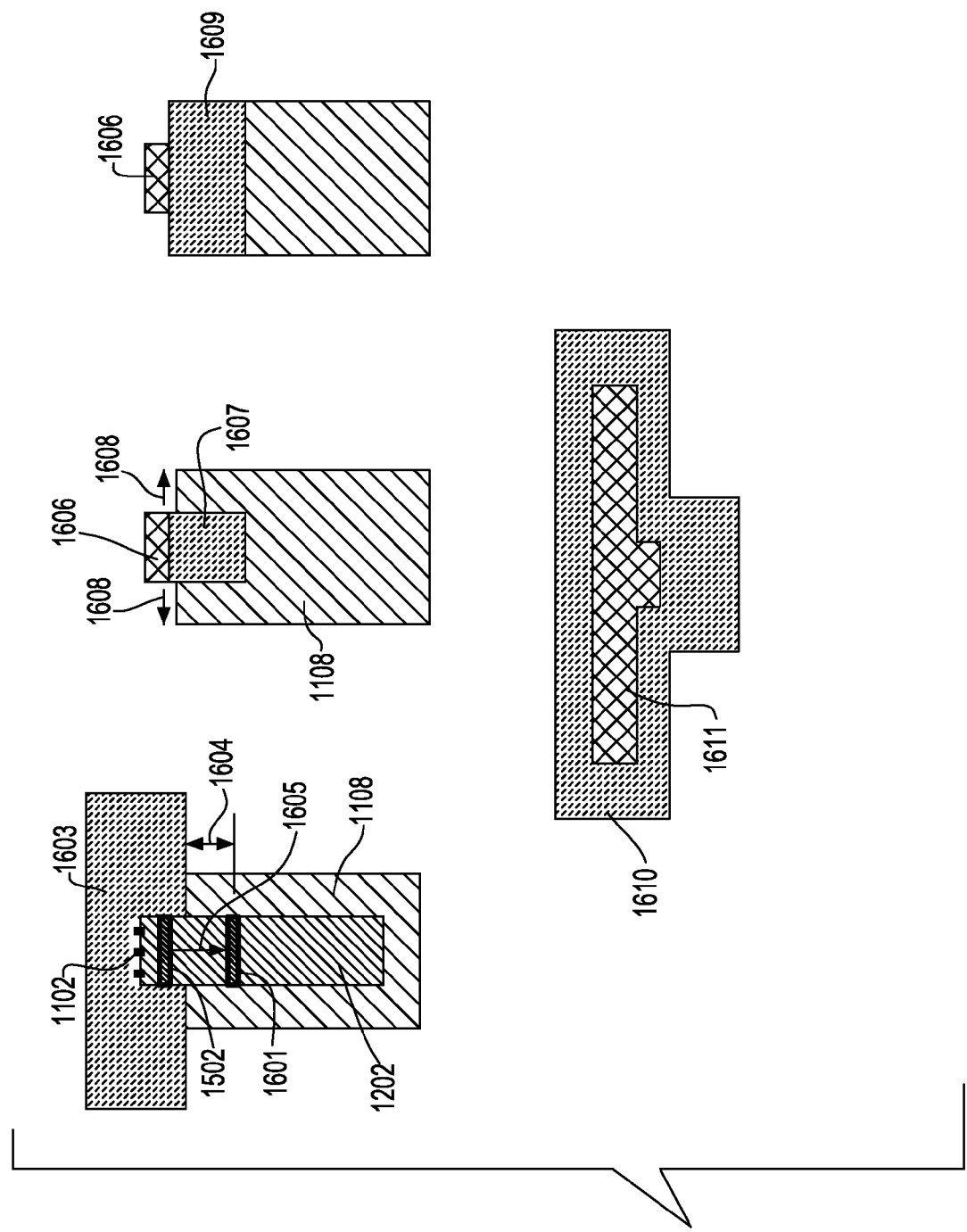
FIGS. 16 and 17 illustrate further improvements limiting the extent of outer tolerance bands. Some overlap region potentially may raise yield concerns.
Figure 17:
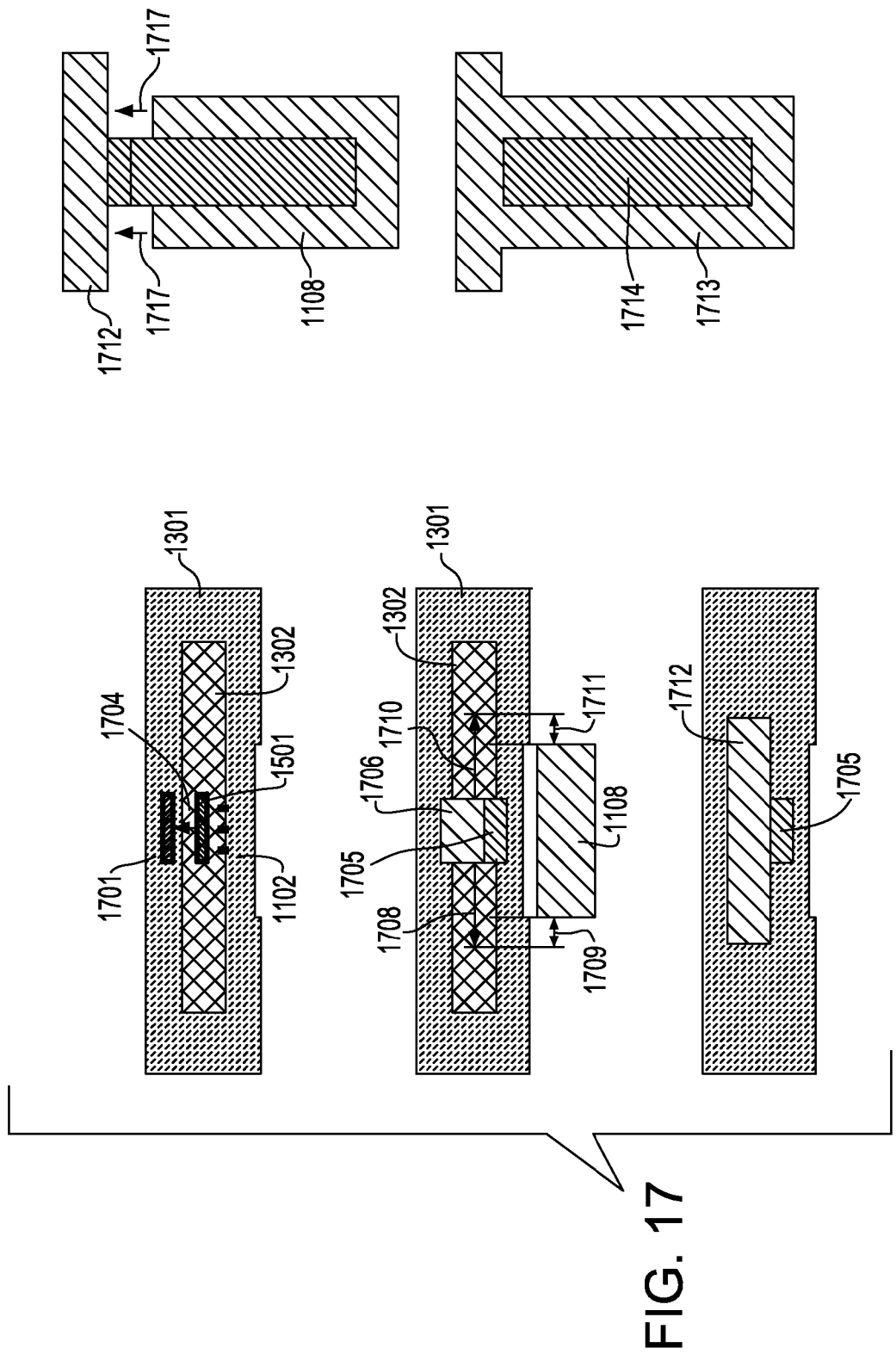

FIGS. 16 and 17 show the use of the new edges 1501 and 1502 to create new decomposed inner tolerance bands, as well as further improvements limiting the extent of the outer tolerance bands. To enable a proper prediction of the final electrical performance and to simplify certain aspects of a process window OPC, it is often desirable to limit the size of the tolerance bands. Thus, referring to FIG. 16, the inner and outer tolerance shapes for Mask A are modified relative to corresponding ones of the FIGS. 11 and 12. In such an instance, the new rectangle 1606 formed using edges 1102 and 1502 is added to Mask A inner tolerance shape 1122 to form a new inner tolerance shape 1611. Edge 1502 is projected away from 1102 to form new edge 1601 in a manner similar to the creation of edge 1204 (FIG. 12). However, the projection distance is limited to distance 1605 which ensures that edge 1601 falls beyond the Mask A outer tolerance band by a distance 1604 greater than or equal to 0, while still ensuring that 1605 is sufficiently small to not introduce additional complexity into the process window OPC algorithm. The exact value of the distance 1605 is determined through optimization of the process window OPC algorithm. This is outside the scope of the present invention. Once distance 1605 is determined and edge 1601 is created, rectangle 1607 can be formed and expanded to 1609 in a manner similar to rectangle 1210 (FIG. 12). Likewise, the outer tolerance band shape 1610 is created in a manner analogous to 1211.

Referring to FIG. 17, the creation of inner tolerance band shape 1714 and outer tolerance band shape 1713 for Mask B is illustrated in a manner similar to FIGS. 11 and 13. Herein, the rectangle 1705 formed between edges 1102 and 1501 is added to the inner tolerance band 1121 to create the new inner tolerance band shape 1714. Edge 1501 is also projected away from 1102 by limited distance 1704 to create new edge 1701. The rectangle 1706 bound by the edges is then expanded by second limited distances 1708 and 1710 that ensure that the new outer tolerance edges are at least aligned or extend beyond the current Mask B outer tolerance edges, resulting in distances 1709 and 1711 being greater than or equal to zero. The new rectangle 1712 formed in this operation is then merged with the existing the Mask B outer tolerance band shape 1108 in a manner analogous to shape 1314 in FIG. 13 to form the new Mask B outer tolerance shape 1713.

Figure 18:
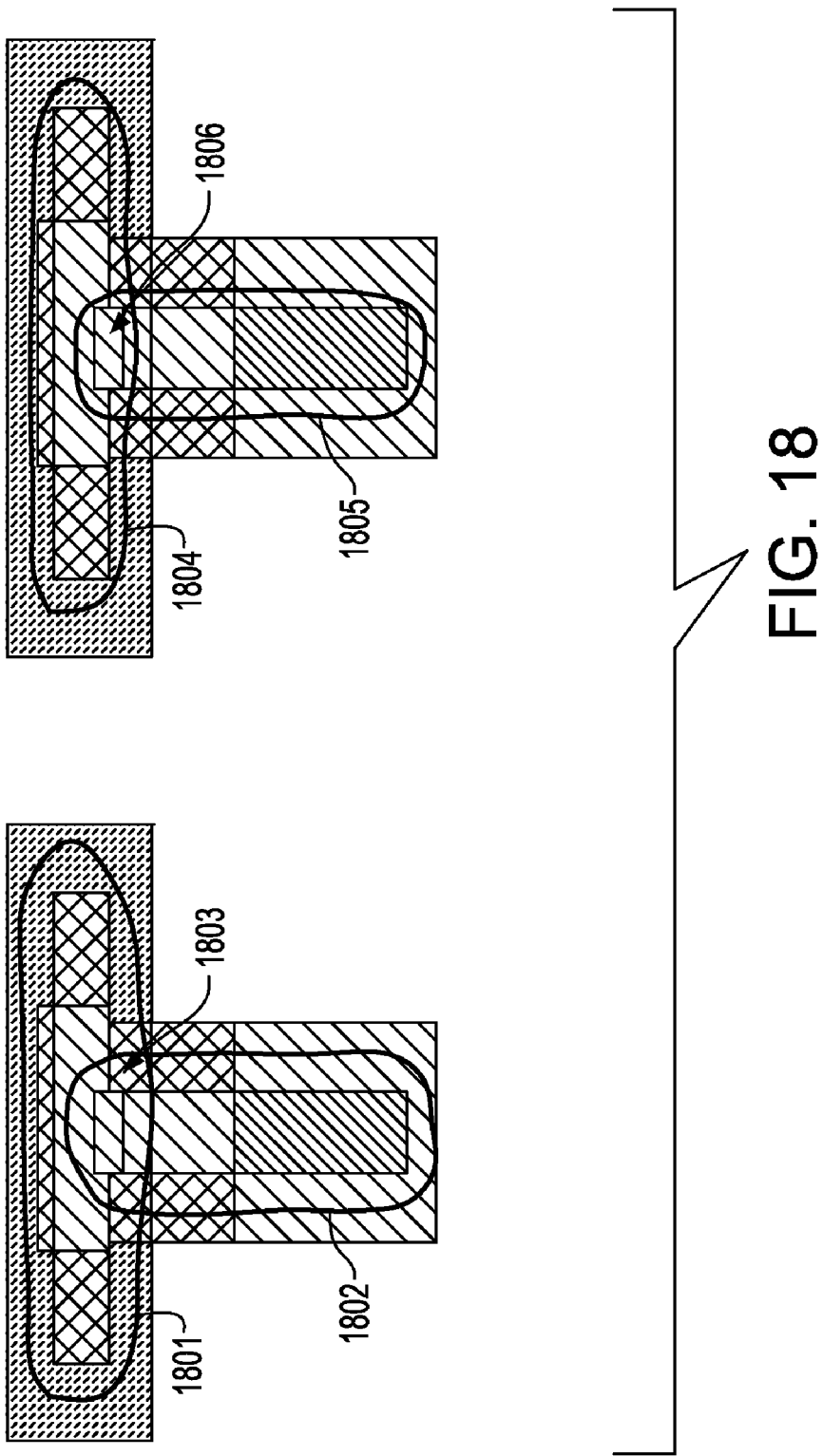
FIG. 18 illustrates improved contours, and more particularly, an improved worst case overlap.

Tolerance bands created using the methodology illustrated by FIGS. 15-19 can then be used to create Masks A and B using process window OPC techniques as previously described. Printed wafer contours resulting from double exposure of the masks is illustrated in FIG. 18. Contours 1801 and 1802 from each exposure show a good overlap in region 1802 at nominal process conditions. Likewise, contours 1804 and 1805 printed at the smaller end of their tolerance continue to show strong overlap in the region 1806, resulting in a significantly improvement over the poor overlap 1406 (FIG. 140, resulting in an improved process latitude under conditions of overlay variation and etch process biases.

Figure 19:
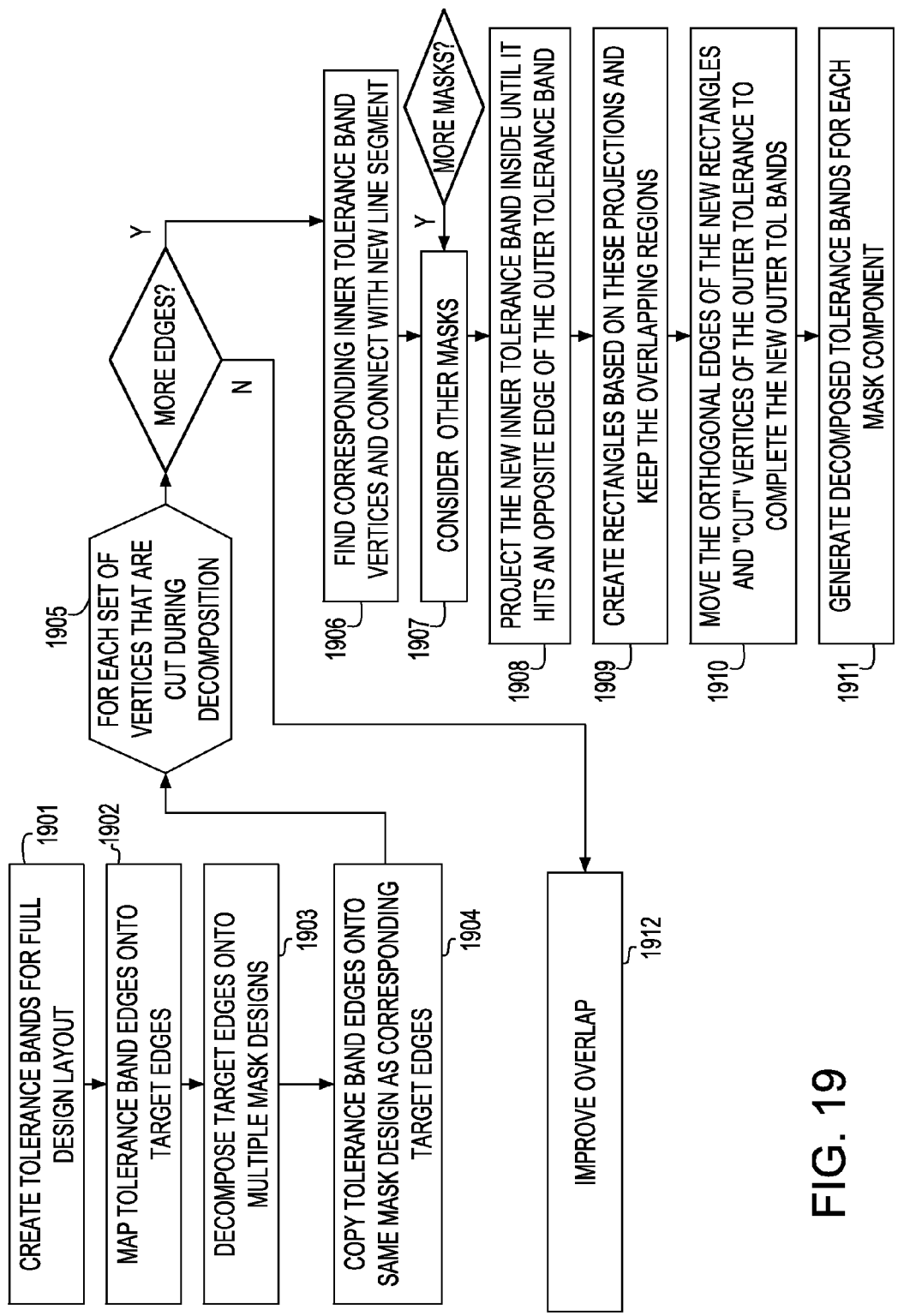
FIG. 19 is a flow chart illustrating a preferred embodiment of the present invention.

FIG. 19 shows a flow chart describing a basic flow to create the tolerance bands on multiple masks previously described and used in conjunction with FIGS. 14 through 18, the combination of which illustrates a preferred embodiment of the present invention.

The basic flow that creates tolerance bands on multiple masks can be achieved in the following manner:

Create tolerance bands, mapping all the tolerance band edges onto corresponding target edges (Blocks 1901, 1902)

Decompose the target edges and copy the corresponding tolerance band edges onto the same masks as the target edges (Blocks 1903, 1904).

For each break in the target shape created during decomposition, create a new inner tolerance band edge at the corresponding vertices. The inner tolerance band edges should be created on all masks affected by the break in target shape (Bock 1905).

Find corresponding inner tolerance band vertices and connect with a new line segment (Block 1906). For each mask affected by the break in the target shape, consider all of the other masks (Block 1907) affected by the break and project the new inner tolerance band edge in the direction of the interior of the inner tolerance until it reaches an opposite edge of the outer tolerance band (Block 1908). Create rectangles based on the projections keeping the overlapping region of all of the rectangles (Block 1909).

Move the orthogonal edges of the new rectangle out until they about at the outer tolerance band of one of the other affected masks. (Block 1910) (1210, FIG. 12).

Move the "cut" vertices of the outer tolerance band being fixed until they reach the new shape created in step 4 (Block 1910) (1207, FIG. 12).

Performed by way of the aforementioned process (see description of FIGS. 11 and 12 for the inner tolerance bands and description of FIG. 13 for the outer tolerance bands) the decomposed tolerance bands can be advantageously used to create mask shapes for multiple masks (Block 1911).

Improve the overlap at all the mask junctions (Block 1912).

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of creating multiple mask designs used in a multiple exposure lithographic patterning process, each of said mask design including a plurality number shapes, the mask design being used for printing a design layout on a semiconductor wafer, the method comprising:
   a) using a computer, creating a first set of tolerance bands (TBs) for each edge of each shape in the design layout, said first set of TBs defining inner and outer tolerance of edge locations of the printed edges;
   b) dividing said edges of each shape in the design layout and said first set of TBs to create a plurality of sets of design edges and a plurality of sets of TBs, with one set of each plurality of sets of design edges and plurality of sets of TBs created for each mask in a multiple exposure lithographic patterning process; and
   c) applying the plurality of sets of TBs to create a plurality of mask designs which when printed in said multiple exposure lithographic patterning process result in wafer shapes having edges printed within the inner and outer tolerance of the design layout defined by said first set of TBs.

2. The method as recited in claim 1, wherein the first set of TBs is an original TB of the design layout.

3. The method as recited in claim 1, wherein said creating said mask design is achieved by performing a correction for process non-linearities.

4. The method as recited in claim 3 wherein said performing correction for process non-linearities includes OPC, etch corrections, mask manufacturing corrections, or any combination thereof.

5. The method as recited in claim 1, further comprising mapping critical components wherein all edge segments of the first set of TBs, including both inner and outer band segments, map to one edge of an original design layout.

6. The method as recited in claim 1 further comprising mapping each TB of said plurality of TB sets to the one edge of the original design layout.

7. The method as recited in claim 6, wherein the original design layout is divided into multiple wafer target designs resulting in each design edge being placed on at least one wafer target design, and wherein each TB mapped to each original design edge is divided to create said plurality of said TB sets.

8. The method as recited in claim 7, further comprising for each break in the design shape created when dividing said design shapes, creating a new inner tolerance band edge at corresponding vertices of said tolerance bands corresponding to said design edges that are broken, with inner tolerance band edges created on all the wafer target designs affected by a break in said design shape.

9. The method as recited in claim 8, wherein for each mask affected by the break in a design shape, all other masks affected are assessed by the break, and wherein the new inner tolerance band edge are projected in direction of the interior of the inner tolerance until hitting an opposing edge.

10. The method as recited in claim 9, further comprising creating rectangles based on the projections and keeping an overlapping region of all of the rectangles.

11. The method as recited in claim 6, further comprising copying the associated tolerance band edge segments onto a wafer target design instead of or in addition to the original design edges.

12. The method as recited in claim 1, further comprising dividing the tolerance bands by mapping each line segment of a tolerance band to a line segment on the original design.

13. The method of claim 1, further comprising:
   d) for each break in the design shape created when dividing said design shapes, creating a new inner tolerance band edge at the corresponding vertices of the tolerance bands corresponding to design edges that are broken with inner tolerance band edges created on all the wafer target designs affected by a break in the design shape;
   e) for each of the masks affected by the break in the design shape, determining any other mask affected by the break and projecting the new inner tolerance band edge in the direction of the interior of the inner tolerance until it reaches an opposite edge;
   f) creating rectangles based on the projections and keeping overlapping regions of all of the rectangles;
   g) moving the edges of the new rectangle that are orthogonal to the new inner tolerance band and its projected edge outward until they reach an outer tolerance band of one of the other affected masks, creating an expanded new rectangle; moving out vertices of the outer tolerance band being fixed until they abut the expanded new rectangle; and
   h) merging the outer tolerance band being fixed with said expanded new rectangle to create the fixed outer tolerance band.

14. A program storage device readable by a machine, tangibly embodying a program of instructions executable by the machine to perform method steps of creating multiple mask designs used in a multiple exposure lithographic patterning process, each of said mask design including a plurality number shapes, the mask design being used for printing a design layout on a semiconductor wafer, the method steps comprising:
   a) using a computer, creating a first set of tolerance bands (TBs) for each edge of each shape in the design layout, said first set of TBs defining inner and outer tolerance of edge locations of the printed edges;
   b) dividing said edges of each shape in the design layout and said first set of TBs to create a plurality of sets of designed edges and a plurality of sets of TBs, with one set of each plurality of sets of design edges and plurality of sets of TBs created for each mask in a multiple exposure lithographic patterning process; and
   c) applying the plurality of sets of TBs to create a plurality of mask designs which when printed in said multiple exposure lithographic patterning process result in wafer shapes having edges printed within the inner and outer tolerance of their desired location as defined by said first set of TBs of the design layout.

* * * * *